US011419237B2

(12) United States Patent
Hori et al.

(10) Patent No.: US 11,419,237 B2
(45) Date of Patent: Aug. 16, 2022

(54) METHOD FOR MANUFACTURING LIQUID-COOLING JACKET

(71) Applicant: NIPPON LIGHT METAL COMPANY, LTD., Tokyo (JP)

(72) Inventors: Hisashi Hori, Shizuoka (JP); Nobushiro Seo, Shizuoka (JP); Kosuke Yamanaka, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 119 days.

(21) Appl. No.: 16/640,661

(22) PCT Filed: May 16, 2018

(86) PCT No.: PCT/JP2018/018966
§ 371 (c)(1),
(2) Date: Feb. 20, 2020

(87) PCT Pub. No.: WO2019/123679
PCT Pub. Date: Jun. 27, 2019

(65) Prior Publication Data
US 2020/0359523 A1    Nov. 12, 2020

(30) Foreign Application Priority Data
Dec. 18, 2017    (JP) .............................. JP2017-241825

(51) Int. Cl.
*B23K 20/00*    (2006.01)
*H05K 7/20*    (2006.01)
(Continued)

(52) U.S. Cl.
CPC ............. *H05K 7/20* (2013.01); *B23K 20/126* (2013.01); *B23K 20/127* (2013.01);
(Continued)

(58) Field of Classification Search
CPC .............. B23K 20/1255; B23K 20/126; B23K 2101/14; B23K 20/122; B23K 20/1265;
(Continued)

(56) References Cited

U.S. PATENT DOCUMENTS 7,275,675 B1 * 10/2007 Carter ................ B23K 20/1255
228/112.1
7,494,040 B2 * 2/2009 Babb ................... B23K 20/1225
228/2.1
(Continued)

FOREIGN PATENT DOCUMENTS

CN    1462220 A    12/2003
CN    105899321 A    8/2016
(Continued)

OTHER PUBLICATIONS

KR-20110088266-A computer english translation (Year: 2011).*
(Continued)

*Primary Examiner* — Erin B Saad
(74) *Attorney, Agent, or Firm* — Merchant & Gould P.C.

(57) ABSTRACT

A method for manufacturing a liquid-cooling jacket (1) where heat transfer fluid flows in a hollow part (14) defined by a jacket body (2) and a sealing body (3) includes: an overlapping process in which the sealing body (3) is placed on an end surface (11a) of a peripheral wall part (11) in such a way that the end surface (11a) and a back surface of the sealing body (3) are overlapped each other to form a first overlapped part (H1); and a primary joining process in which primary joining is performed by friction stirring in such a way that a rotary tool (F1) is moved once around a recessed part (13) along the first overlapped part (H1). In the primary joining process, the first overlapped part (H1) is joined in a state where the tip side pin is in contact with only the sealing body (3) or with the jacket body (2) and the
(Continued)

sealing body (3) while the base side pin is in contact with the sealing body (3).

15 Claims, 13 Drawing Sheets

(51) Int. Cl.
  *B23K 20/12* (2006.01)
  *B23K 101/04* (2006.01)
  *B23K 101/18* (2006.01)
  *B23K 101/36* (2006.01)
  *B23K 101/14* (2006.01)

(52) U.S. Cl.
  CPC .... *B23K 20/1255* (2013.01); *B23K 2101/045* (2018.08); *B23K 2101/14* (2018.08); *B23K 2101/18* (2018.08); *B23K 2101/36* (2018.08)

(58) Field of Classification Search
  CPC ............ B23K 20/129; B23K 2101/045; B23K 2103/10; B23K 20/1225; B23K 20/1235; B23K 20/123; B23K 20/124; B23K 2101/36; B23K 20/12; B23K 20/2336; B23K 2101/04; B23K 2101/18; B23K 2103/18; B23K 20/1245; B23K 20/127; B23K 20/227; B23K 20/24; B23K 2101/06; B23K 2103/05; B23K 31/125; B23K 33/006; B23K 37/0235; B23K 37/0531
  See application file for complete search history.

(56) References Cited

U.S. PATENT DOCUMENTS

| | | | | |
|---|---|---|---|---|
| 8,434,661 | B2* | 5/2013 | Hovanski | B23K 20/1255 228/112.1 |
| 11,059,125 | B2* | 7/2021 | Rosal | B23K 20/1255 |
| 2004/0108359 | A1 | 6/2004 | Hashimoto et al. | |
| 2005/0246884 | A1* | 11/2005 | Chen | B23K 20/1225 29/525 |
| 2007/0241163 | A1* | 10/2007 | Valant | B23K 20/1255 228/2.1 |
| 2008/0154423 | A1* | 6/2008 | Badarinarayan | B23K 20/123 700/175 |
| 2016/0325374 | A1* | 11/2016 | Hori | B23K 20/124 |
| 2018/0272479 | A1* | 9/2018 | Hori | B23K 20/1265 |
| 2019/0358740 | A1* | 11/2019 | Hori | B23K 20/122 |
| 2020/0147718 | A1* | 5/2020 | Hori | B23K 20/1225 |

FOREIGN PATENT DOCUMENTS

| | | | | |
|---|---|---|---|---|
| JP | 4210148 | B2 | | 1/2009 |
| JP | 2013-39613 | A | | 2/2013 |
| JP | 2015-131323 | A | | 7/2015 |
| JP | 2016-215264 | A | | 12/2016 |
| JP | 2017-042817 | A | | 3/2017 |
| KR | 20110088266 | A | * | 8/2011 .......... B23K 20/126 |

OTHER PUBLICATIONS

International Search Report for No. PCT/JP2018/018966 dated Jun. 19, 2018.
Office Action for Chinese Patent Application No. 201880053294.0 (dated Jul. 19, 2021).

* cited by examiner

METHOD FOR MANUFACTURING LIQUID-COOLING JACKET

This application is a National Stage Application of PCT/JP2018/018966, filed May 16, 2018, which claims benefit of priority to Japanese Patent Application No. 2017-241825, filed Dec. 18, 2017, which applications are incorporated herein by reference. To the extent appropriate, a claim of priority is made to each of the above disclosed applications.

TECHNICAL FIELD

The present invention relates to a method for manufacturing a liquid-cooling jacket.

BACKGROUND ART

As a method for manufacturing a liquid-cooling jacket, there is a method in which a sealing body made of metal is overlapped on a jacket body made of metal, and friction stir welding is performed from a front surface side of the sealing body. And as a rotary tool to be used in friction stir welding, there is known a rotary tool provided with a shoulder part and a stirring pin which is hung down from the shoulder part. This rotary tool is a tool by which friction stir welding is performed in a state where the lower end surface of the shoulder part is pushed into a metal member. By pushing the shoulder part into the metal member, plastically fluidized material can be held to reduce generation of burrs. However, in a case where a joining height position is changed, defects tend to be caused, so that there are problems that a large recessed groove is generated and a lot of burrs are generated.

On the other hand, there is known a friction stir welding method using a rotary tool provided with a stirring pin to join two metal members, the method comprising a primary joining process in which the stirring pin which is rotating is inserted in a butting part between the metal members, and friction stir welding is performed in a state where only the stirring pin is in contact with the metal members (Patent Document 1). According to this conventional technique, since a helical groove is formed on the outer surface of the stirring pin and friction stir welding is performed in a state where only the stirring pin is in contact with members to be joined together and the base end thereof is exposed, defects can be suppressed even if a joining height position is changed, and the load on the friction stir welding apparatus can be also reduced. However, since plastically fluidized material is not held by the shoulder part, there are problems that a recessed groove to be generated on a surface of the metal members is made large and the surface roughness of the joined part is made large. Furthermore, there is a problem that an expanded part (a part of the surface of a metal member, the part being expanded relative to the original surface before the joining) is generated beside the recessed groove.

In Patent Document 2, a rotary tool provided with a shoulder part and a stirring pin hanging down from the shoulder part is disclosed. The shoulder part and the stirring pin are each provided with a tapered surface on their outer peripheral surfaces. A spiral groove in a plan view is formed on the tapered surface of the shoulder part. A cross sectional shape of the spiral groove is a half circle. Joining can be stably performed by providing the tapered surface even in a case where the thickness of a metal member or the height position of the joining is changed. Since plastically fluidized material flows into the groove, the flowing of the plastically fluidized material can be controlled to form a proper plasticized region.

PRIOR ART DOCUMENT

Patent Document

Patent Document 1: Japanese Unexamined Patent Publication No. 2013-39613
Patent Document 2: Japanese Patent No. 4210148

SUMMARY OF THE INVENTION

Problem to be Solved by the Invention

However, in the conventional technique of Patent Document 2, since plastically fluidized material enters the inside of the groove on the tapered surface, there is a problem that the groove does not work. Furthermore, when plastically fluidized material enters the groove, friction stirring is performed in a state where the plastically fluidized material has adhered to the groove. Therefore, there is a problem that the metal members to be joined together and the adhered material rub against each other to lower the joining quality. And still more, there are problems that the roughness of the joined surface is made large, a lot of burrs are generated, and a recessed groove to be generated on the joined surface is made large.

From such a view point, an objective of this invention is to provide a method for manufacturing a liquid-cooling jacket, the method being capable of making the recessed groove to be generated on the joined surface small and the roughness of the joined surface small.

Means for Solving the Problem

In order to solve the problem, the present invention is characterized by a method for manufacturing a liquid-cooling jacket, the liquid-cooling jacket including: a jacket body having a bottom part and a frame-like peripheral wall part standing on a periphery of the bottom part; and a sealing body to seal a recessed part of the jacket body, the jacket body and the sealing body together defining a hollow part in which heat transport fluid flows, the method comprising: an overlapping process in which the sealing body is placed on an end surface of the peripheral wall part in such a way that the end surface and a back surface of the sealing body are overlapped each other to form a first overlapped part; and a primary joining process in which primary joining is performed by friction stirring, the primary joining process including inserting a rotary tool provided with a base side pin and a tip side pin in the first overlapped part from a front surface of the sealing body and moving the rotary tool once around the recessed part along the first overlapped part in a state where the base side pin and the tip side pin are in contact with the sealing body, wherein a tapered angle of the base side pin is larger than another tapered angle of the tip side pin, wherein a stair-like step part is formed on an outer peripheral surface of the base side pin, and wherein in the primary joining process, the first overlapped part is joined in a state where the tip side pin is in contact with only the sealing body or with both the jacket body and the sealing body while the base side pin is in contact with the sealing body.

According to the method for manufacturing a liquid-cooling jacket, since the base side pin having a large tapered angle can hold the sealing body with the outer peripheral surface thereof, a recessed groove to be generated on the joined surface can be made small, and an expanded part to be generated beside the recessed groove can be excluded or can be made small. Since the stair-like step part is shallow and the exit is wide, the plastically fluidized material is hard to adhere to the outer peripheral surface of the base side pin even though the base side pin holds the sealing body. Accordingly, the roughness of the joined surface can be made small, and the joining quality can be suitably made stable. Furthermore, because of having the tip side pin, it can be easily inserted to a deeper position.

It is preferable that a support part is provided on either the bottom part of the jacket body or the back surface of the sealing body and comes into contact with the other.

According to the method for manufacturing a liquid-cooling jacket, the strength of the liquid-cooling jacket can be enhanced because of the support part.

It is preferable that the jacket body is provided with a support part standing on the bottom part and to come into contact with the back surface of the sealing body, and in the primary joining process, in addition to friction stir welding to the first overlapped part, friction stir welding is performed also to a second overlapped part where the back surface of the sealing body and an end surface of the support part are overlapped each other.

It is preferable that in the primary joining process, the second overlapped part is joined in a state where the tip side pin is in contact with only the sealing body or with both the jacket body and the sealing body while the base side pin is in contact with the sealing body.

According to the method for manufacturing a liquid-cooling jacket, since friction stir welding is performed also to the second overlapped part, the joining strength between the jacket body and the sealing body can be more enhanced.

It is preferable that the support part is formed continuously with the peripheral wall part, and in the primary joining process, friction stir welding is performed to the first overlapped part and to the second overlapped part continuously.

According to the method for manufacturing a liquid-cooling jacket, since friction stir welding can be performed to the first overlapped part and to the second overlapped part continuously, the liquid-cooling jacket having high deformation-resistance can be manufactured, and a production cycle can be improved.

It is preferable that the support part is formed continuously with one wall part of the peripheral wall part and apart from another wall part facing the one wall part, and in the primary joining process, the rotary tool is inserted in the front surface of the sealing body at a position corresponding to the support part, friction stir welding is performed to the first overlapped part and to the second overlapped part continuously, and then the rotary tool is pulled up from the sealing body at an outer position than a plasticized region generated in the first overlapped part.

According to the method for manufacturing a liquid-cooling jacket, since friction stir welding can be performed to the first overlapped part and to the second overlapped part continuously, the liquid-cooling jacket having high deformation-resistance can be manufactured and a production cycle can be improved. In addition, in a case where the rotary tool is moved to an inner position than the plasticized region, there is a risk that metal material flows out of the first overlapped part formed by the peripheral wall part and the sealing body and the second overlapped part. However, since the rotary tool is moved to an outer position than the plasticized region and then is pulled up, such a problem can be resolved.

It is preferable that the jacket body is provided with a support part standing on the bottom part and to come into contact with the back surface of the sealing body, the support part having a projection part on an end surface of the support part, the sealing body is provided with a hole part in which the projection part is inserted, in the overlapping process, the projection part is inserted in the hole part in such a way that a hole wall of the hole part and a side surface of the projection part are butted each other to form a butting part and a second overlapped part where the back surface of the sealing body and the end surface of the support part are overlapped each other, and in the primary joining process, in addition to friction stir welding to the first overlapped part, friction stir welding is performed also to the second overlapped part where the back surface of the sealing body and the end surface of the support part are overlapped each other and to the butting part where the hole wall of the hole part of the sealing body and the side surface of the projection part of the support part are butted each other.

According to the method for manufacturing a liquid-cooling jacket, in the overlapping process, the projection part formed on the end surface of the support part is inserted in the hole part of the sealing body. Hence, positioning of the sealing body can be easily done by fixing the sealing body to the support part. Still more, in the primary joining process, since friction stir welding can be performed also to the butting part where the hole wall of the hole part and the side surface of the projection part are butted each other, the joining strength between the jacket body and the sealing body can be more enhanced.

It is preferable that in the primary joining process, as to friction stir welding to the butting part, the second overlapped part and the butting part are each joined in a state where the base side pin is in contact with both the jacket body and the sealing body, and a tip of the tip side pin is inserted more deeply than the second overlapped part.

According to the method for manufacturing a liquid-cooling jacket, the tip of the tip side pin is inserted more deeply than the second overlapped part. Thereby, oxide films of the second overlapped part and the butting part can be surely divided. Hence, the joining strength can be enhanced.

It is preferable that a repairing process, in which a pull-up trace of the rotary tool is repaired by filling the pull-up trace with weld metal, the pull-up trace remaining on the front surface of the sealing body, is performed.

According to the method for manufacturing a liquid-cooling jacket, the pull-up trace of the rotary tool disappears, and the front surface of the liquid-cooling jacket can be finished flatly.

It is preferable that in the primary joining process, a cooling plate is provided on the bottom part of the jacket body, and friction stir welding is performed while cooling the jacket body and the sealing body.

According to the method for manufacturing a liquid-cooling jacket, since frictional heat can be suppressed low, the deformation of the liquid-cooling jacket due to thermal contraction can be reduced.

It is preferable that a cooling path of the cooling plate, along which a cooling medium flows, has a plane shape at least along a moving locus of the rotary tool.

According to the method for manufacturing a liquid-cooling jacket, since a portion to which friction stirring is performed can be cooled intensively, cooling efficiency can be improved.

It is preferable that a cooling path of the cooling plate, along which a cooling medium flows, is composed of a cooling pipe embedded in the cooling plate.

According to the method for manufacturing a liquid-cooling jacket, management of the cooling medium is easy.

It is preferable that in the primary joining process, friction stir welding is performed while letting a cooling medium flow in an inside of the jacket body to cool the jacket body and the sealing body.

According to the method for manufacturing a liquid-cooling jacket, since frictional heat can be suppressed low, the deformation of the liquid-cooling jacket due to thermal contraction can be reduced. Still more, cooling can be done with the use of the jacket body itself without any cooling plate or the like.

It is preferable that a plurality of fins are provided on at least either the bottom part of the jacket body or the back surface of the sealing body.

According to the method for manufacturing a liquid-cooling jacket, a liquid-cooling jacket having high cooling efficiency can be manufactured.

Effect of the Invention

According to the method for manufacturing a liquid-cooling jacket according to the present invention, a recessed groove to be generated on the joined surface can be made small and the roughness of the joined surface can be made small.

MODE FOR CARRYING OUT THE INVENTION

First Embodiment

Figure 1:
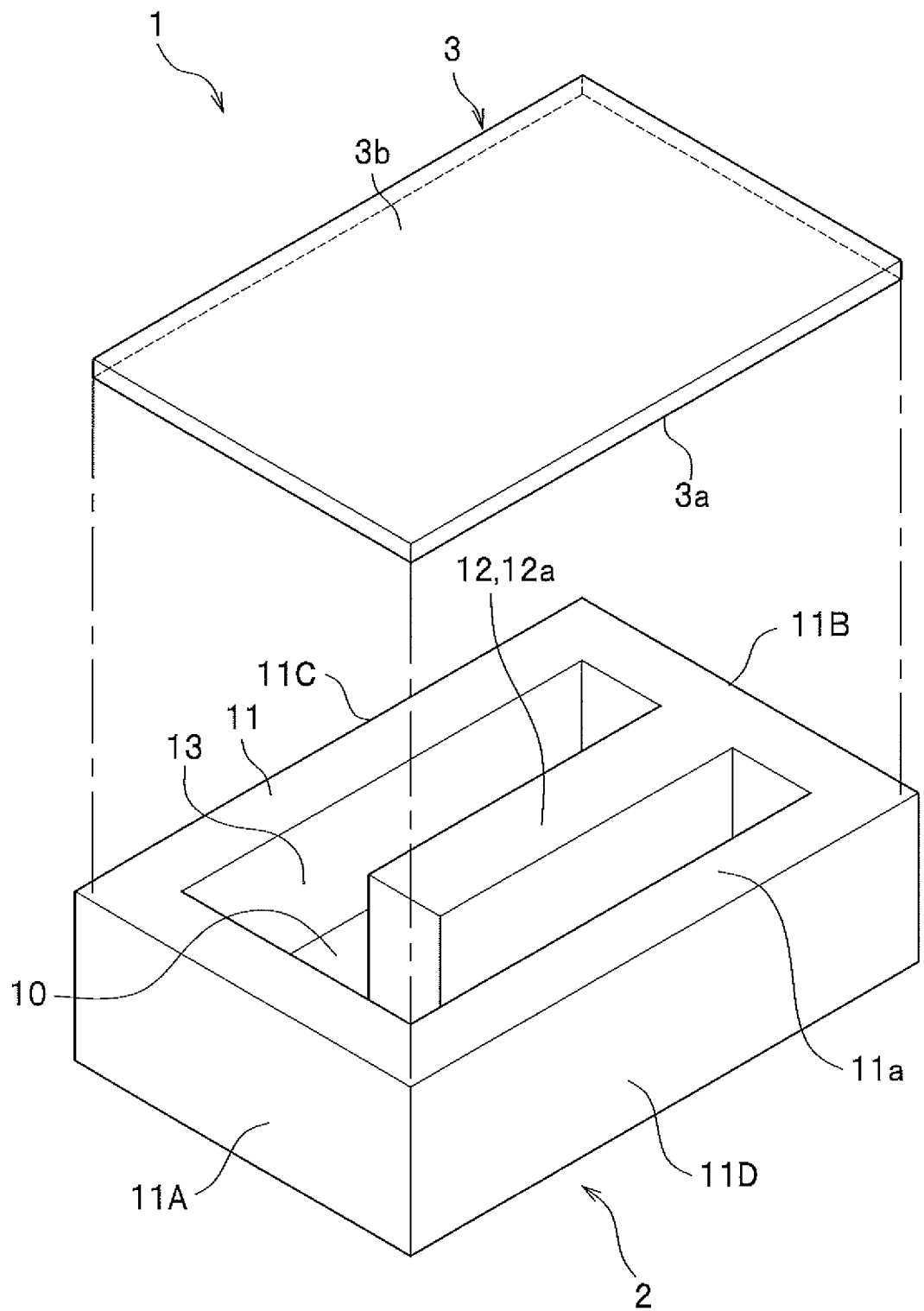
FIG. 1 is an exploded perspective view showing a liquid-cooling jacket according to a first embodiment of the present invention.

As shown in FIG. 1, a first embodiment of the present invention is a method for manufacturing a liquid-cooling jacket 1 in a hollow part of which heat transport fluid flows, the hollow part being defined by a jacket body 2 and a sealing body 3. Note that, "a front surface" in the following description means a surface opposite to "a back surface".

First, structures of the jacket body 2 and the sealing body 3 will be explained. The jacket body 2 is a box-shaped body opening upward. The jacket body 2 is formed by including a bottom part 10, a frame-like peripheral wall part 11 standing on the periphery of the bottom part 10, and a support part 12. The jacket body 2 is made of metal appropriately selected from among metals, to which friction stirring is capable of being performed, such as aluminum, an aluminum alloy, copper, a copper alloy, titanium, a titanium alloy, magnesium, a magnesium alloy. For example, an aluminum alloy casting material (for example, JIS ADC12 or the like) forged by die-casting may be used. The peripheral wall part 11 is composed of wall parts 11A, 11B, 11C, 11D which each have the same plate thickness. The wall parts 11A, 11B are short side parts facing each other. The wall parts 11C, 11D are long side parts facing each other. In the space surrounded by the bottom wall part 10 and the peripheral wall part 11, a recessed part 13 is formed.

The support part 12 stands on the bottom part 10 and has a shape of a rectangular parallelepiped. And the support part 12 is continuous with the wall part 11B and extended toward the wall part 11A. There is a prescribed distance between a front end of the support part 12 and the wall part 11A facing the wall part 11B. An end surface 12a of the support part 12 and an end surface 11a of the peripheral wall part 11 are flush with each other.

The sealing body 3 is a plate-like member having a rectangular shape in a plan view. Sizes of length and width of the sealing body 3 in a plan view are a bit smaller than sizes of length and width of the jacket body 2 in a plan view. The sealing body 3 is made of metal appropriately selected from among metals, to which friction stirring is capable of being performed, such as aluminum, an aluminum alloy, copper, a copper alloy, titanium, a titanium alloy, magnesium, a magnesium alloy. For example, an aluminum alloy material (for example, JIS A6063 or the like) made by extrusion may be used.

Next, a method for manufacturing the liquid-cooling jacket according to the first embodiment of the present invention will be explained. In the method for manufacturing the liquid-cooling jacket, a preparation process, an overlapping process, a fixing process, a provisional joining process, a primary joining process, and a deburring process are performed.

The preparation process is a process to prepare the jacket body 2 and the sealing body 3 shown in FIG. 1.

Figure 2:
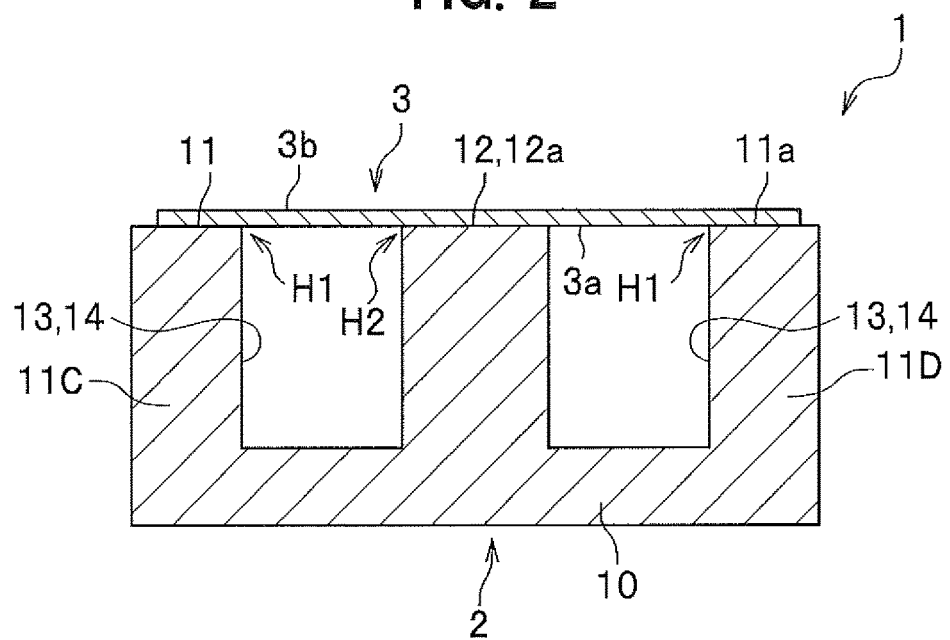
FIG. 2 is a cross sectional view showing an overlapping process of a method for manufacturing the liquid-cooling jacket according to the first embodiment of the present invention.

As shown in FIG. 2, the overlapping process is a process in which the sealing body 3 is put on the jacket body 2. That is, with a back surface 3a of the sealing body 3 facing the underside and a front surface 3b thereof facing the upper side, the sealing body 3 is put on the jacket body 2. Thus, a first overlapped part H1 is formed by overlapping the back surface 3a of the sealing body 3 and the end surface 11a of the peripheral wall part 11 each other. The first overlapped part H1 has a rectangular frame shape in a plan view. Furthermore, a second overlapped part H2 is formed by overlapping the back surface 3a of the sealing body 3 and the end surface 12a of the support part 12 each other. The second overlapped part H2 is straight.

The fixing process is a process in which the jacket body 2 and the sealing body 3 are fixed to a fixing member (not shown) such as a table. The jacket body 2 and the sealing body 3 are fastened to a table or the like not to move by means of a fixture such as a clamp.

The provisional joining process is a process in which the jacket body 2 and the sealing body 3 are provisionally joined. The provisional joining process can be performed by performing spot joining to the first overlapped part H1 at an inner corner defined by the end surface 11a and a side surface of the sealing body 3. The spot joining may be performed by friction stirring or welding. Furthermore, the provisional joining process can be omitted.

Figure 3:
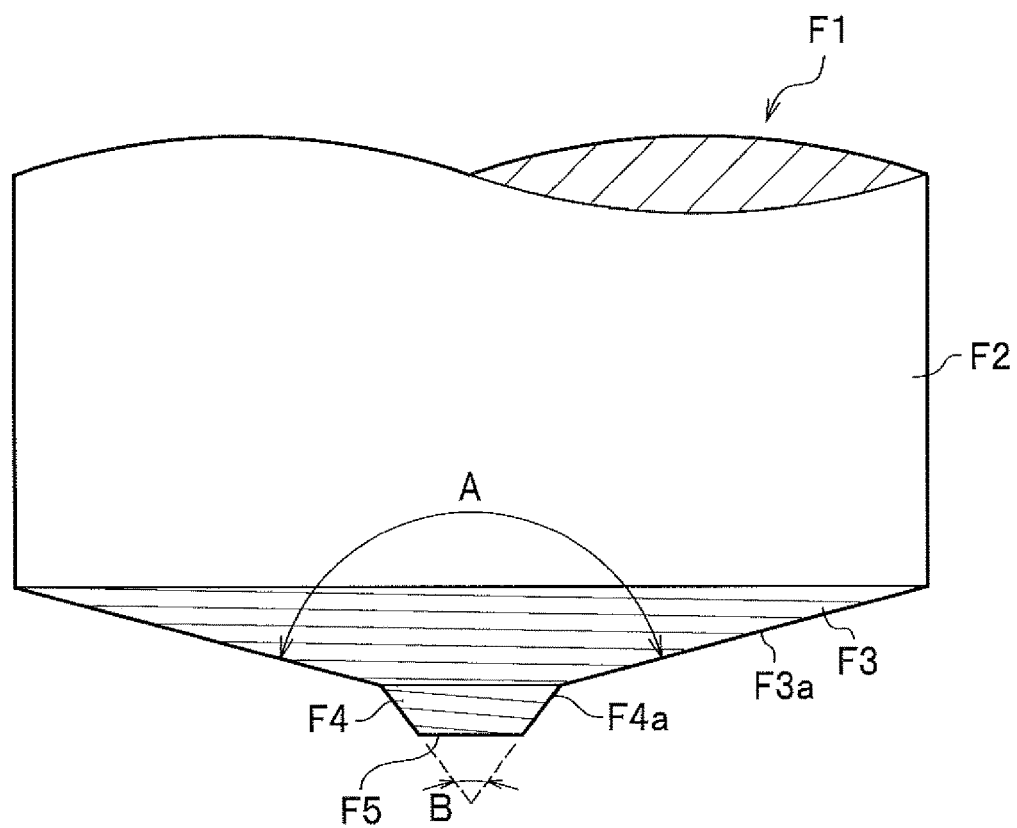
FIG. 3 is a side view showing a rotary tool.

The primary joining process is a process in which the jacket body 2 and the sealing body 3 are joined together by friction stirring with the use of a rotary tool F1 shown in FIG. 3. At first, the rotary tool F1 to be used in the primary joining process will be explained. As shown in FIG. 3, the rotary tool F1 is a tool to be used in friction stir welding. The rotary tool F1 is made of, for example, tool steel. The rotary tool F1 is mainly composed of a base shaft F2, a base side pin F3, and a tip side pin F4. The base shaft F2 has a cylindrical shape and is a part to be connected to a spindle of a friction stir welding device. The flat surface F5 of the tip side pin F4 is perpendicular to the rotational axis.

Figure 4:
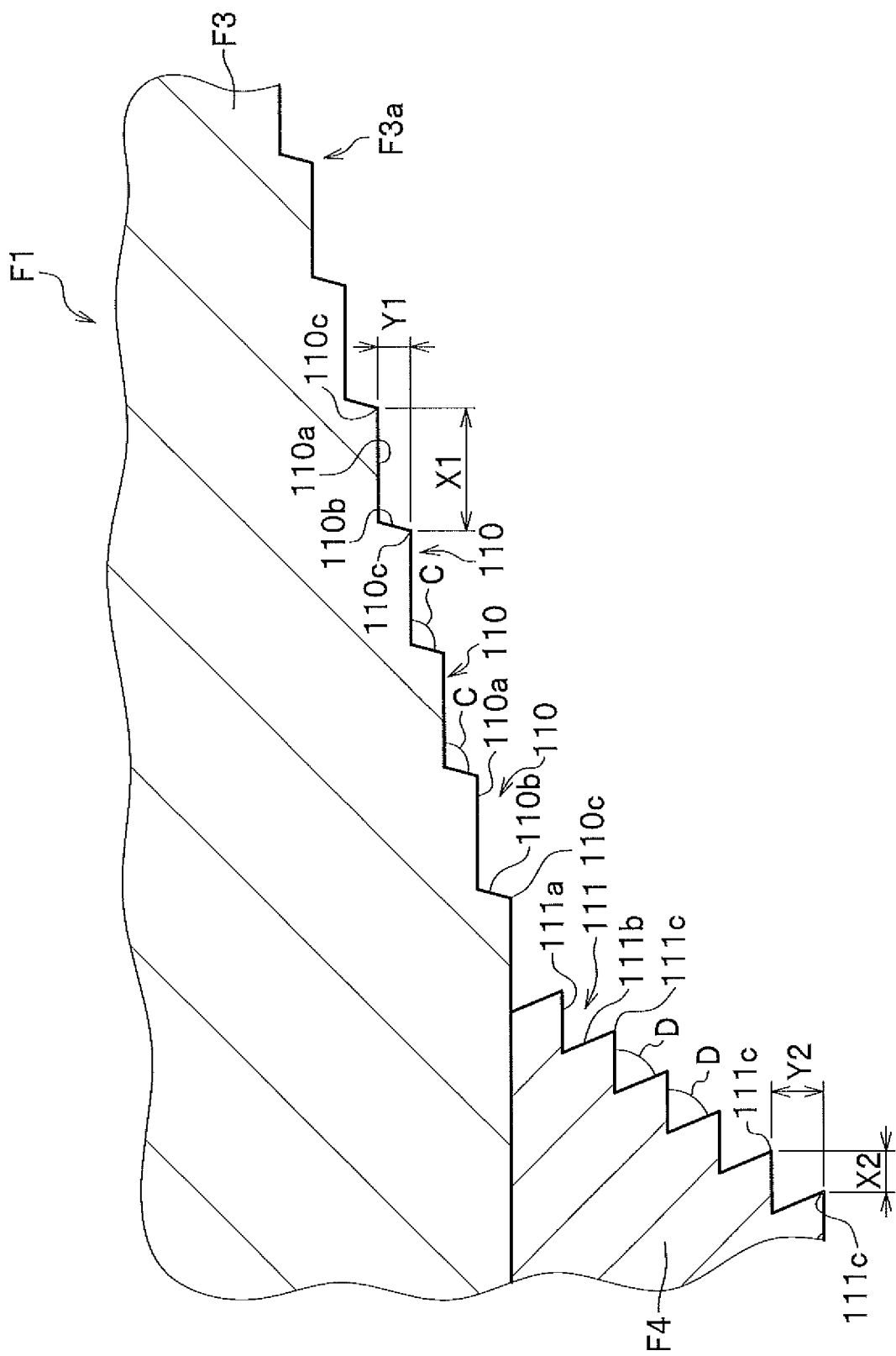
FIG. 4 is an enlarged cross sectional view of the rotary tool.

The base side pin F3 is continuous with the base shaft F2, and has a shape becoming smaller toward a tip thereof. The base side pin F3 has a circular truncated cone shape. The taper angle A of the base side pin F3 may be appropriately set, and is, for example, 135 to 160 degrees. In a case where the taper angle A is less than 135 degrees, or more than 160 degrees, the roughness of a joined surface after performing of friction stirring is large. The taper angle A is larger than a taper angle B of the tip side pin F4 to be described later. As shown in FIG. 4, a step part 110 like stairs is formed on the outer peripheral surface of the base side pin F3 over the whole in a height direction. The step part 110 is spirally formed in a clockwise direction or a counterclockwise direction. That is, the step part 110 is spiral in a plan view, and like stairs in a side view. In this embodiment, since the rotary tool is rotated clockwise, the step part 110 is set counterclockwise from the base side toward the tip side.

Note that, in a case where the rotary tool is rotated counterclockwise, it is preferable that the step part 110 is formed clockwise from the base side toward the tip side. Thereby, plastically fluidized metal is led toward the tip side via the step part 110, so that the amount of metal to leak to the outside of the metal members to be joined together can be reduced. The step part 110 is composed of step bottom surfaces 110a and step side surfaces 110b. The distance X1 (horizontal distance) between both apexes 110c, 110c of the step part 110 adjacent to each other is appropriately set according to a step angle C to be described later and the height Y1 of the step side surface 110b.

The height Y1 of the step side surface 110b may be appropriately set and is set to, for example, 0.1 to 0.4 mm. In a case where the height Y1 is less than 0.1 mm, the roughness of the joined surface is made large. On the other hand, in a case where the height Y1 is larger than 0.4 mm, the roughness of the joined surface is made large and the number of effective steps (the number of the step part 110 being in contact with the metal members to be joined together) also decreases.

The step angle C defined by the step bottom surface 110a and the step side surface 110b may be appropriately set. The step angle C is set to, for example, 85 to 120 degrees. The step bottom surface 110a is parallel with a horizontal plane in this embodiment. The step bottom surface 110a may be slanted within the range of—5 degrees to 15 degrees relative to a horizontal plane from the rotational axis of the tool toward the outer periphery (a minus sign means being downward relative to a horizontal plane, and a plus sign means being upward relative to a horizontal plane). The distance X1, the height Y1 of the step side surface 110b, the step angle C, and the angle of the step bottom 110a relative to a horizontal plane are appropriately set so that plastically fluidized material can flow out to the outside without staying in or adhering to the inside of the step part 110, and the step bottom surface 110a can hold the plastically fluidized material to lower the roughness of the joined surface when friction stirring is performed.

The tip side pin F4 is formed continuously with the base side pin F3. The tip side pin F4 has a circular truncated cone shape. The tip side pin F4 has the flat surface F5 at the tip thereof. The flat surface F5 is perpendicular to the rotational axis of the rotary tool F1. The tapered angle B of the tip side pin F4 is smaller than the tapered angle A of the base side pin F3. A spiral groove 111 is formed on the outer peripheral surface of the tip side pin F4. The spiral direction of the spiral groove 111 may be either clockwise or counterclockwise. In this embodiment, since the rotary tool F1 is rotated clockwise, the spiral groove is formed counterclockwise from the base side toward the tip side.

Note that, in a case where the rotary tool is rotated counterclockwise, it is preferable that the spiral groove 111 is formed clockwise from the base side toward the tip side. Thereby, plastically fluidized material is led to the tip side via the spiral groove 111. Therefore, metal which leaks outside the metal members to be joined can be reduced. The spiral groove 111 is composed of a spiral bottom surface 111a and a spiral side surface 111b. The distance (distance in a horizontal direction) between adjacent apexes 111c, 111c of the spiral groove 111 is set to be a length X2. The height of the spiral side surface 111b is set to be a height Y2. The spiral angle D defined by the spiral bottom surface 111a and the spiral side surface 111b is set to, for example, 45 to 90 degrees. The spiral groove 111 comes into contact with the metal members to be joined together to increase frictional heat and has a role to lead plastically fluidized material toward the tip side.

The primary joining process of this embodiment includes a second overlapped part joining process in which friction stir welding is performed to the second overlapped part H2 and a first overlapped part joining process in which friction stir welding is performed to the first overlapped part H1. The primary joining process will be explained with the use of FIGS. 5 to 8.

Figure 5:
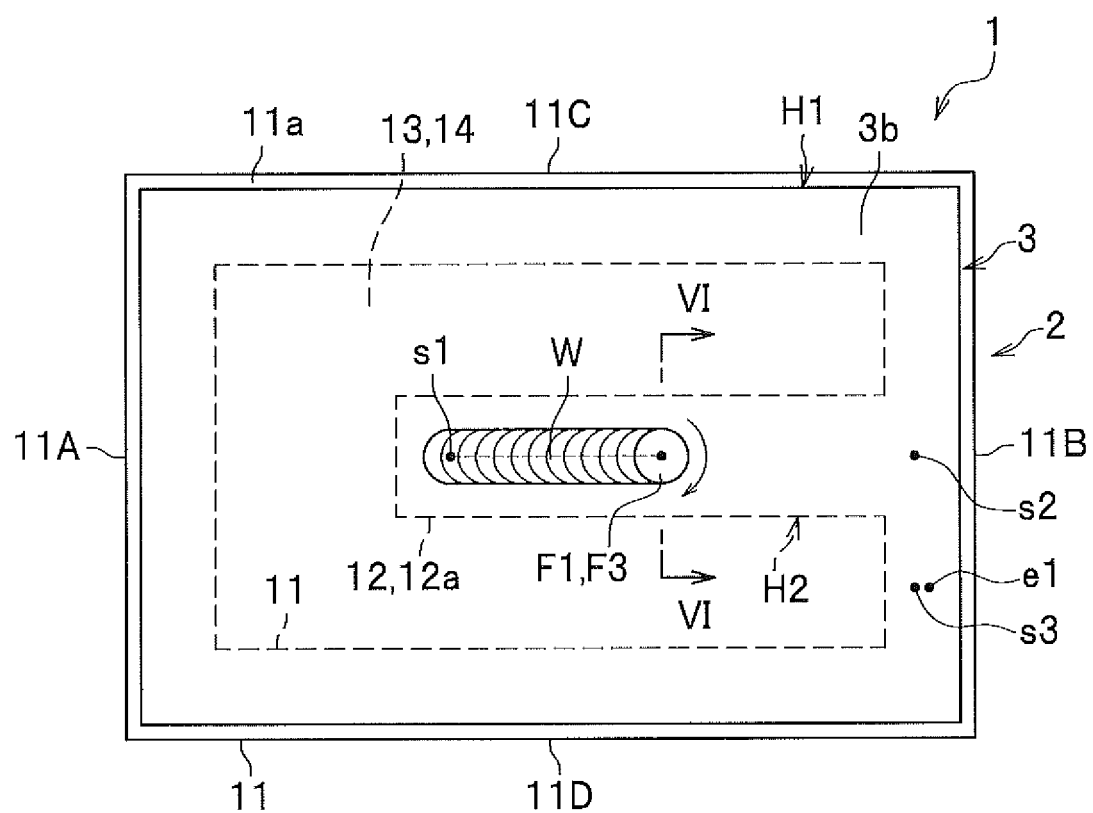
FIG. 5 is a plan view showing a primary joining process of the method for manufacturing the liquid-cooling jacket according to the first embodiment of the present invention.
Figure 6:
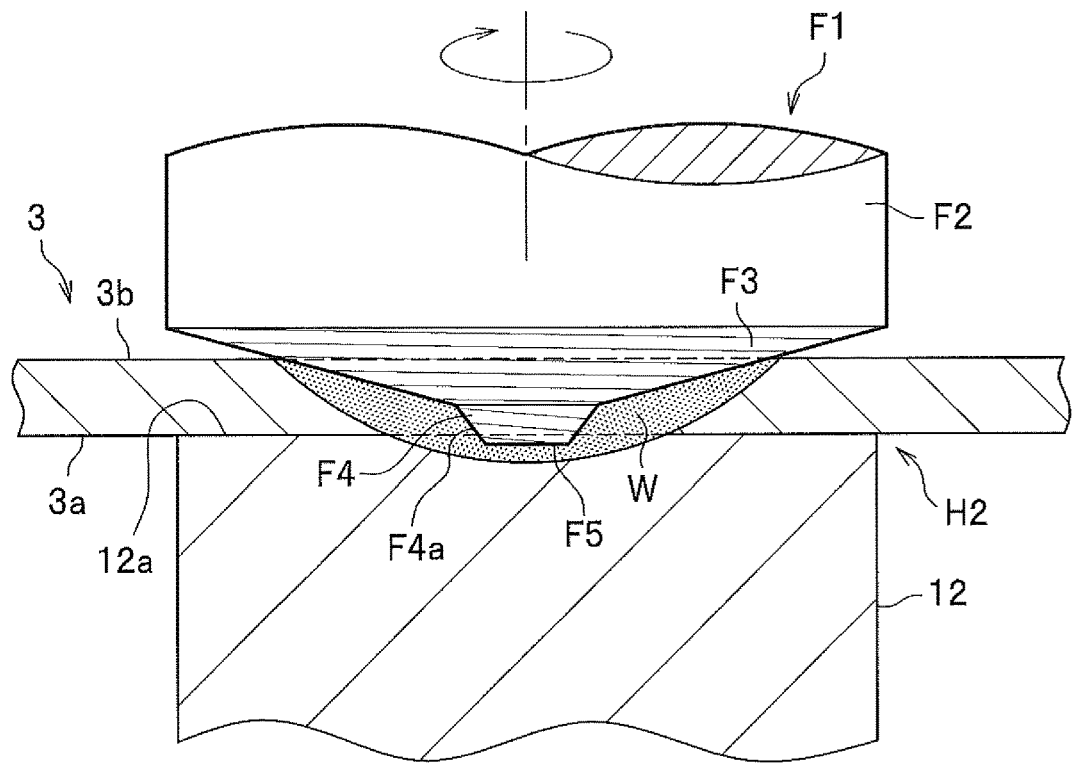
FIG. 6 is a cross sectional view taken along the line VI-VI of FIG. 5.

As shown in FIG. 5, in the second overlapped part joining process, the tip side pin F4 of the rotary tool F1 being rotated clockwise is inserted in the front surface 3b of the sealing body 3 at a start position s1 which is set at a position corresponding to a front end portion of the support part 12 (front end on the wall part 11A side). In the second overlapped part joining process, as shown in FIG. 6, friction stir welding is performed in a state where the base side pin F3 and the tip side pin F4 are in contact with the sealing body 3. The insertion depth of the rotary tool F1 is set so that at least a portion of the base side pin F3 comes into contact with the front surface 3b of the sealing body 3. That is, friction stir welding is performed while the outer peripheral surface of the base side pin F3 of the rotary tool F1 is holding the front surface 3b of the sealing body 3. Furthermore, friction stir welding is performed in a state where the tip side pin F4 is in contact with only the sealing body 3, or the jacket body 2 and the sealing body 3. In this embodiment, friction stir welding is performed in a state where the tip side pin F4 is in contact with the jacket body 2 and the sealing body 3. That is, the insertion depth of the rotary tool F1 is set so that the flat surface F5 of the tip side pin F4 is located at a position lower than the second overlapped part H2 (end surface 12a of the support part 12). In other words, the insertion depth of the rotary tool F1 is set so that the second overlapped part H2 is located at the side surface of the tip side pin F4. And the rotary tool F1 is moved along the second overlapped part H2 while being kept at a constant height. Namely, the rotary tool F1 is moved in the longitudinal direction of the support part 12. In the second overlapped part joining process, the back surface 3a of the sealing body 3 and the end surface 12a of the support part 12 are joined together by friction stirring. Plasticized region W is generated along a moving locus of the rotary tool F1.

Figure 7:
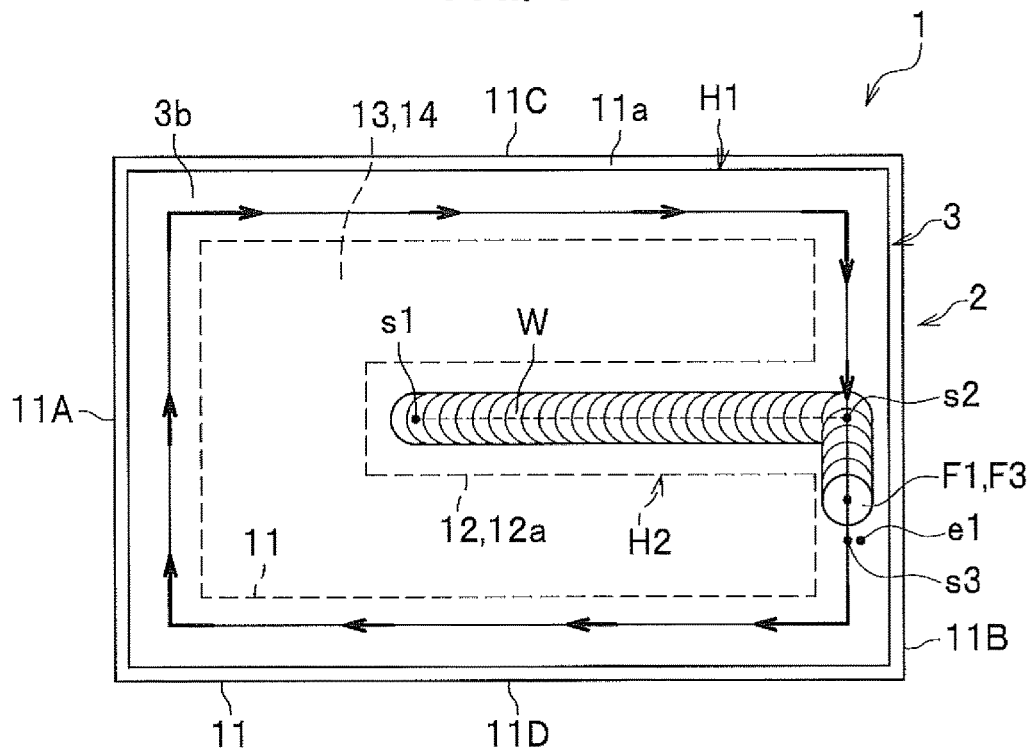
FIG. 7 is a plan view showing the primary joining process of the method for manufacturing the liquid-cooling jacket according to the first embodiment of the present invention.

After the rotary tool F1 is moved up to a first middle point s2 which is set in the first overlapped part H1, the rotary tool F1 is transferred to the first overlapped part joining process as it is without being pulled up. As shown in FIG. 7, in the first overlapped part joining process, the rotary tool F1 is moved along the first overlapped part H1. That is, the rotary tool F1 is moved once around the recessed part 13 along the peripheral wall part 11 clockwise as shown by arrows.

In the first overlapped part joining process, similarly to the second overlapped part joining process, friction stir welding is performed in a state where the base side pin F3 and the tip side pin F4 are in contact with the sealing body 3. An insertion depth of the rotary tool F1 is also set similarly to the second overlapped part joining process so that at least a portion of the base side pin F3 comes into contact with the front surface 3b of the sealing body 3. That is, friction stir welding is performed while the outer peripheral surface of the base side pin F3 of the rotary tool F1 is holding the front surface 3b of the sealing body 3. Furthermore, friction stir welding is performed in a state where the tip side pin F4 is in contact with only the sealing body 3, or the jacket body 2 and the sealing body 3. In this embodiment, friction stir welding is performed in a state where the tip side pin F4 is in contact with the jacket body 2 and the sealing body 3. That is, the insertion depth of the rotary tool F1 is set so that the flat surface F5 of the tip side pin F4 is located at a position lower than the first overlapped part H1 (end surface 11a of the peripheral wall part 11). In other words, the insertion depth of the rotary tool F1 is set so that the first overlapped part H1 is located at the side surface of the tip side pin F4. And the rotary tool F1 is moved along the first overlapped part H1 while being kept at a constant height.

Note that, the insertion depth of the rotary tool F1 need not necessarily be kept constant. For example, the insertion depth may be changed between the first overlapped part joining process and the second overlapped part joining process. Since the rotary tool F1 is not provided with a shoulder part, the insertion depth can be easily changed.

In the primary joining process, it is desired that joining conditions are set so that burrs are generated at a position having a distance from the recessed part 13. A position at which burrs are generated varies according to the joining conditions. The joining conditions are determined by each element of a rotational speed of the rotary tool F1, a rotational direction of the rotary tool F1, a movement speed (feed speed) of the rotary tool F1, an advancing direction of the rotary tool F1, an inclination angle (tapered angle) of the base side pin F3 or the tip side pin F4, materials of metal members (the jacket body 2 and the sealing body 3) to be joined together, thicknesses of the metal members to be joined together, and so on, and a combination of these elements.

For example, in a case where the rotational speed of the rotary tool F1 is low, the temperature of plastically fluidized material on a shear side easily becomes higher than that on a flow side. The flow side is a retreating side, that is, a side that the movement speed of the rotary tool F1 is subtracted from the tangential speed of the outer surface of the rotary tool F1. The shear side is an advancing side, that is, a side that the movement speed of the rotary tool F1 is added to the tangential speed of the outer surface of the rotary tool F1. Therefore, a lot of burrs tend to be generated on the shear side at a position which is outside the plasticized region. On the other hand, for example, in a case where the rotational speed of the rotary tool F1 is high, the temperature of the plastically fluidized material on the shear side rises more, but a lot of burrs tend to be generated on the flow side at a position which is outside the plasticized region as much as the rotational speed is high.

In this embodiment, since the rotational speed of the rotary tool F1 is set to be low, in the friction stir welding to the first overlapped part H1, a lot of burrs tend to be generated at a position having a distance from the recessed part 13, the position being on the shear side and outside the plasticized region W. Note that, joining conditions of the rotary tool F1 are not limited to those already explained, and can be appropriately set.

Thus, in a case where joining conditions are set so that burrs or a lot of burrs are generated at a position having a distance from the recessed part 13, burrs can be concentrated to a position having a distance from the recessed part 13. Therefore, that is preferable since a deburring process to be described later can be easily performed.

As shown in FIG. 7, after the rotary tool F1 is moved by one round along the first overlapped part H1 as shown by arrows, it is moved via the first middle point s2 up to a second middle point s3 as it is. Then, the rotary tool F1 is moved up to an end point e1 which is set to be an outer position than the second middle point s3 within the front surface 3b of the sealing body 3. And then, the rotary tool F1 is pulled upward to be removed from the sealing body 3.

After the rotary tool F1 is removed from the sealing body 3, in a case where there remains a pull-up trace on the front surface 3b, a repairing process in which the pull-up trace is repaired may be performed. In the repairing process, for example, the pull-up trace can be repaired by performing build-up welding to fill the pull-up trace with weld metal. Thereby, the front surface 3b can be made flat.

The deburring process is a process in which burrs exposed on the front surface 3b of the sealing body 3 by performing the primary joining process are removed. In the deburring process, burrs are removed by using a cutting tool or the like. Thereby, the front surface 3b of the sealing body 3 can be finely finished.

Figure 8:
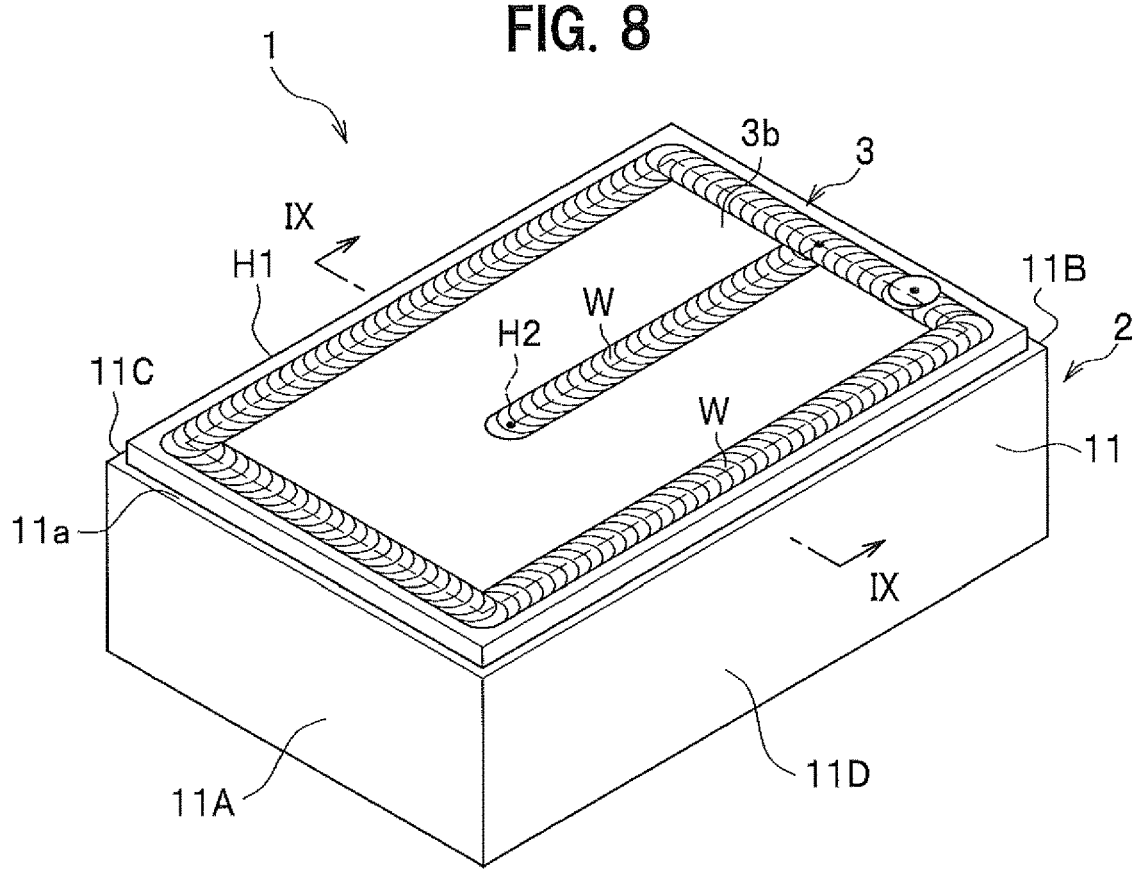
FIG. 8 is a perspective view showing the liquid-cooling jacket according to the first embodiment of the present invention.
Figure 9:
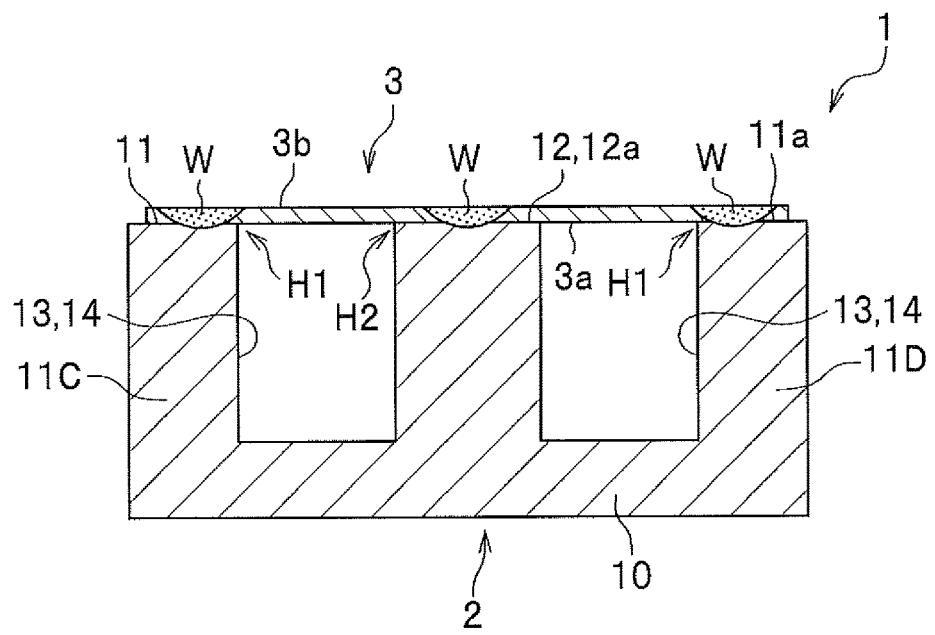
FIG. 9 is a cross sectional view taken along the line IX-IX of FIG. 8.

Byway of the above processes, the liquid-cooling jacket 1 shown in FIGS. 8, 9 is manufactured.

As shown in FIGS. 8, 9, the liquid-cooling jacket 1 is manufactured by performing friction stirring to the jacket body 2 and the sealing body 3 to integrate them. Regarding the liquid-cooling jacket 1, the first overlapped part H1 where the back surface 3a of the sealing body 3 and the end surface 11a of the peripheral wall part 11 overlap with each other and the second overlapped part H2 where the back surface 3a of the sealing body 3 and the end surface 12a of the support part 12 overlap with each other are continuously joined by friction stirring. The plasticized region W is generated in a portion to which friction stirring is performed. Inside the liquid-cooling jacket 1, the hollow part 14, in which heat transport fluid that transports heat to the outside flows, is formed.

Figure 10:
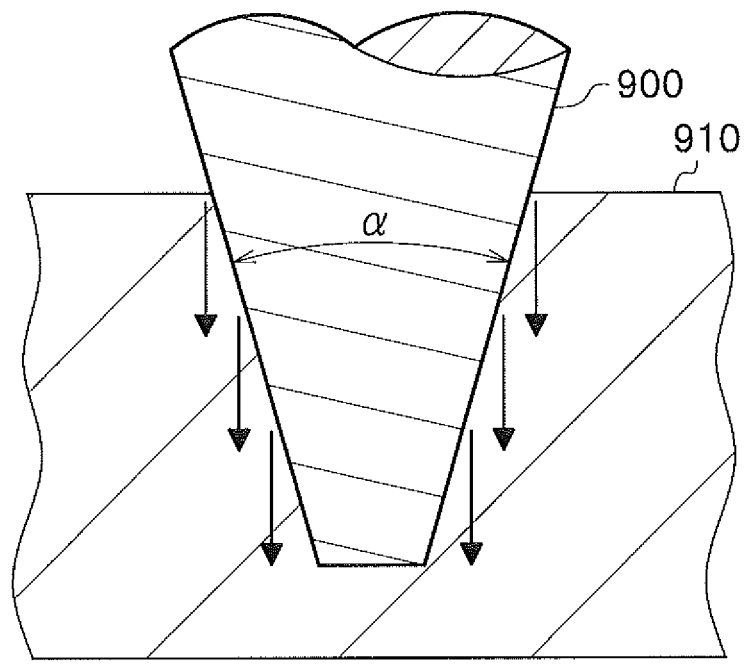
FIG. 10 is a schematic view showing a conventional rotary tool.
Figure 11:
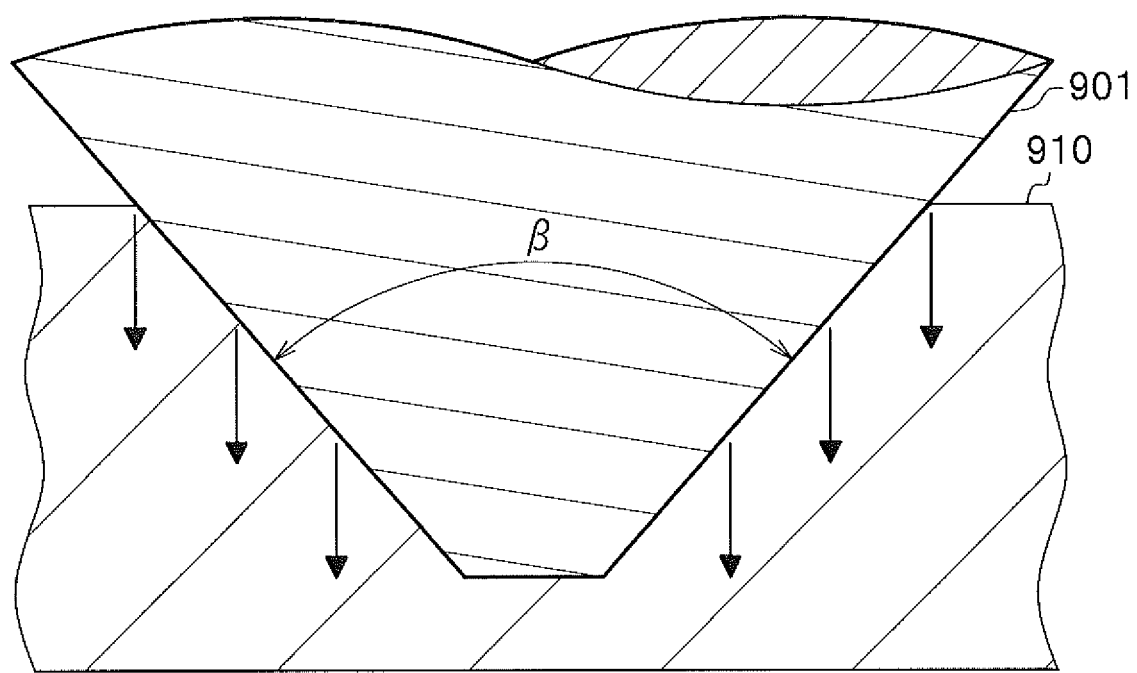
FIG. 11 is a schematic view showing a conventional rotary tool.

As shown in FIG. 10, a conventional rotary tool 900 does not hold a surface (or surfaces) of metal members 910 to be joined together with the use of a shoulder part. Therefore, there are problems that a recessed groove, which is a groove formed by the surface of the plasticized region and the surface of the metal members to be joined together, is large and the roughness of the joined surface is large. Furthermore, there is a problem that an expanded part (a part of the surface of the metal members to be joined together, the part being expanded relative to the original surface before the joining) is generated beside the recessed groove. On the other hand, like a rotary tool 901 in FIG. 11, in a case where a tapered angle β of the rotary tool 901 is larger than the tapered angle α of the rotary tool 900, the surface of the metal members to be joined together can be held in comparison with the case of the rotary tool 900. Hence, the recessed groove is made small and the expanded part is also made small. However, since downward flowing of the plastically fluidized material is made strong, a kissing bond is easily generated in a lower portion of the plasticized region.

In contrast, the rotary tool F1 of this embodiment is provided with the base side pin F3 and the tip side pin F4 having the tapered angle smaller than the tapered angle A of the base side pin F3. Therefore, the rotary tool F1 is easily inserted in the sealing body 3. Furthermore, since the tapered angle B of the tip side pin F4 is small, the rotary tool F1 can be easily inserted to a deep position of the sealing body 3. And further, since the tapered angle B of the tip side pin F4 is small, the downward flowing of the plastically fluidized material can be reduced in comparison with the rotary tool 901. Hence, the kissing bond can be prevented from being generated in a lower portion of the plasticized region W. On the other hand, since the tapered angle A of the base side pin F3 is large, joining can be stably performed in comparison with a conventional rotary tool even in a case where the thickness of metal members to be joined together or the height position of the joining changes.

Still more, since plastically fluidized material can be held by the outer peripheral surface of the base side pin F3, a recessed groove generated on the joined surface can be made small, and an expanded part to be generated beside the recessed groove can be excluded or can be made small.

Furthermore, since the stair-like step part 110 is shallow and the exit is wide, plastically fluidized material easily flows out to the outside of the step part 110 while being held by the step bottom surface 110a. Therefore, though the base side pin F3 holds plastically fluidized material, the plastically fluidized material is hard to adhere to the outer peripheral surface of the base side pin F3. Accordingly, the roughness of the joined surface can be made small, and the joining quality can be suitably made stable.

In this embodiment, since the flat surface F5 of the tip side pin F4 is inserted more deeply than the second overlapped part H2 and the first overlapped part H1, oxide films of the second overlapped part H2 and the first overlapped part H1 can be surely divided. Therefore, the joining strength of the first overlapped part H1 and that of the second overlapped part H2 can be enhanced.

Furthermore, since the support part 12 which comes into contact with the sealing body 3 is provided on the bottom part 10 of the jacket body 2, the strength of the liquid-cooling jacket 1 can be enhanced by the support part 12. Note that, the support part 12 can be provided on the back surface 3a of the sealing body 3.

Note that, friction stir welding need not be performed to the second overlapped part H2. However, in a case where friction stir welding is performed also to the second overlapped part H2 similarly to this embodiment, the joining strength between the jacket body 2 and the sealing body 3 can be more enhanced.

Still further, the support part 12 is formed continuously with the peripheral wall part 11, and in the primary joining process, friction stir welding is continuously performed to the first overlapped part H1 and to the second overlapped part H2. Thanks to that, the liquid-cooling jacket 1 having high deformation-resistance can be manufactured, and a production cycle can be improved.

Furthermore, in a case where the rotary tool F1 is moved inward from the plasticized region W and is pulled up from that position after finishing friction stir welding to the first overlapped part H1 and the second overlapped part H2, there is a risk that metal material flows into the inside from the second overlapped part H2 and the first overlapped part H1 formed by the peripheral wall part 11 and the sealing body 3. However, in the primary joining process, such a problem can be resolved by pulling up the rotary tool F1 from the position to which the rotary tool F1 has been moved outward from the plasticized region W.

Still further, in a case where the repairing process, in which weld metal is buried in the pull-up trace of the rotary tool F1, the pull-up trace remaining on the front surface 3b of the sealing body 3, is performed to repair the trace, the pull-up trace due to the rotary tool F1 disappears, so that the surface of the liquid-cooling jacket 1 can be finished flatly.

Modified Examples of First Embodiment

In the following modified examples of the first embodiment and other embodiments, description of technical matters common to the first embodiment is omitted, and different matters will be mainly described. Furthermore, each member similar to that in the case of the first embodiment has the same symbol and will not be described.

Figure 12:
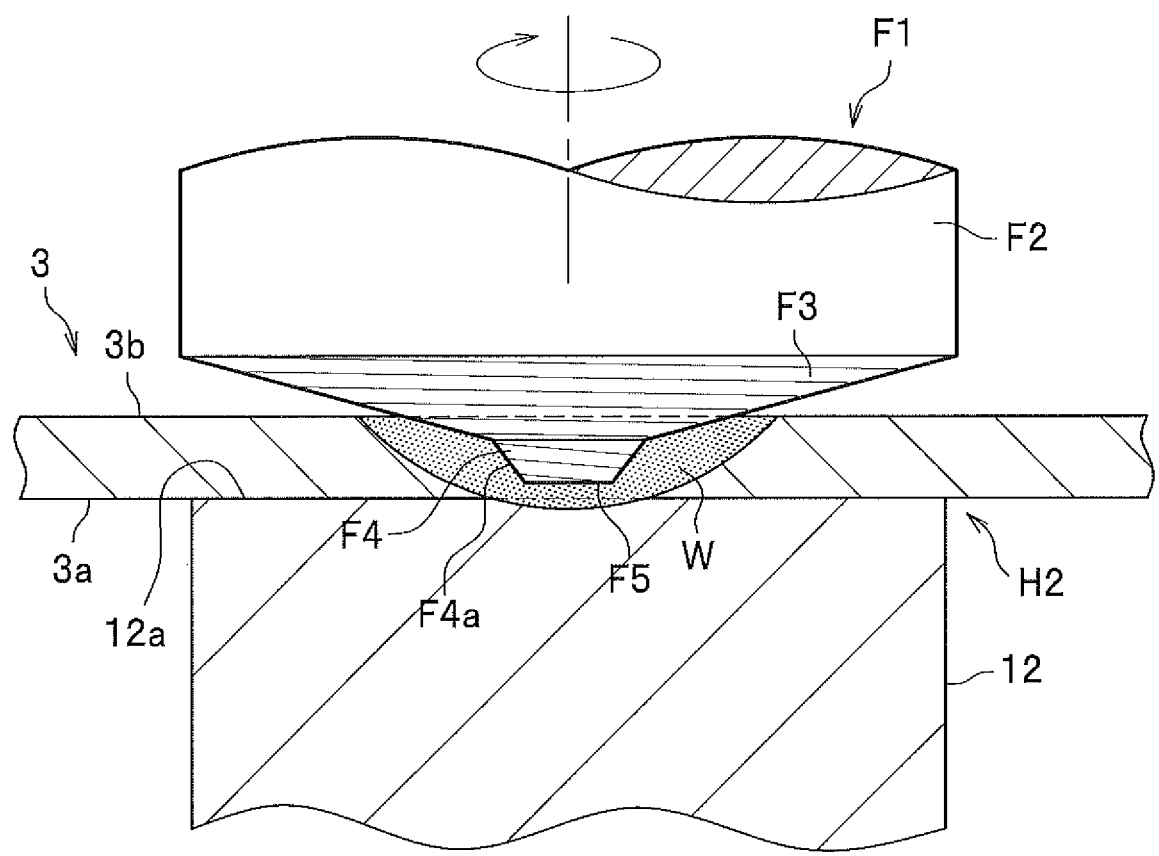
FIG. 12 is a cross sectional view showing a first modified example of the method for manufacturing the liquid-cooling jacket according to the first embodiment.

Next, a first modified example of the method for manufacturing the liquid-cooling jacket according to the first embodiment will be described. As shown in FIG. 12, the modified example differs from the first embodiment on an insertion depth of the rotary tool F1 used in the primary joining process.

The insertion depth of the rotary tool F1 is set so that at least a portion of the base side pin F3 comes into contact with the front surface 3b of the sealing body 3. Furthermore, friction stir welding is performed in a state where the tip side pin F4 is in contact with only the sealing body 3. That is, the insertion depth of the rotary tool F1 is set so that the flat surface F5 of the tip side pin F4 is located at a position higher than the second overlapped part H2 (end surface 12a of the support part 12). And the rotary tool F1 is moved along the second overlapped part H2 while being kept at a constant height. The sealing body 3 is plastically fluidized by frictional heat due to the rotary tool F1. Hence, the back surface 3a of the sealing body 3 and the end surface 12a of the support part 12 are joined together by friction stirring. The plasticized region W is generated along the moving locus of the rotary tool F1.

Similarly also in the first overlapped part joining process, friction stir welding may be performed in a state where at least a part of the base side pin F3 is in contact with the front surface 3b of the sealing body 3 and the tip side pin F4 is in contact with only the sealing body 3. The state where the tip side pin F4 is in contact with only the sealing body 3 means a state where the flat surface F5 of the tip side pin F4 is located at a position higher than the first overlapped part H1.

Also in the primary joining process of this modified example, advantageous effects roughly equivalent to the first embodiment can work. That is, since the base side pin F3 can hold the plastically fluidized material with the outer peripheral surface thereof, a recessed groove to be generated on the joined surface can be made small, and an expanded part to be generated beside the recessed groove can be eliminated or can be made small. Since the stair-like step part 110 is shallow and the exit is wide, plastically fluidized material easily flows out to the outside of the step part 110 while being held by the step bottom surface 110a. Therefore, though the base side pin F3 holds the plastically fluidized material, the plastically fluidized material is hard to adhere to the outer peripheral surface of the base side pin F3. Accordingly, the roughness of the joined surface can be made small, and the joining quality can be suitably made stable.

In this modified example, the flat surface F5 of the tip side pin F4 is not inserted more deeply than the first overlapped part H1 and the second overlapped part H2. However, in a case where the plasticized region W reaches the first overlapped part H1 and the second overlapped part H2, the joining strength can be enhanced.

Figure 13:
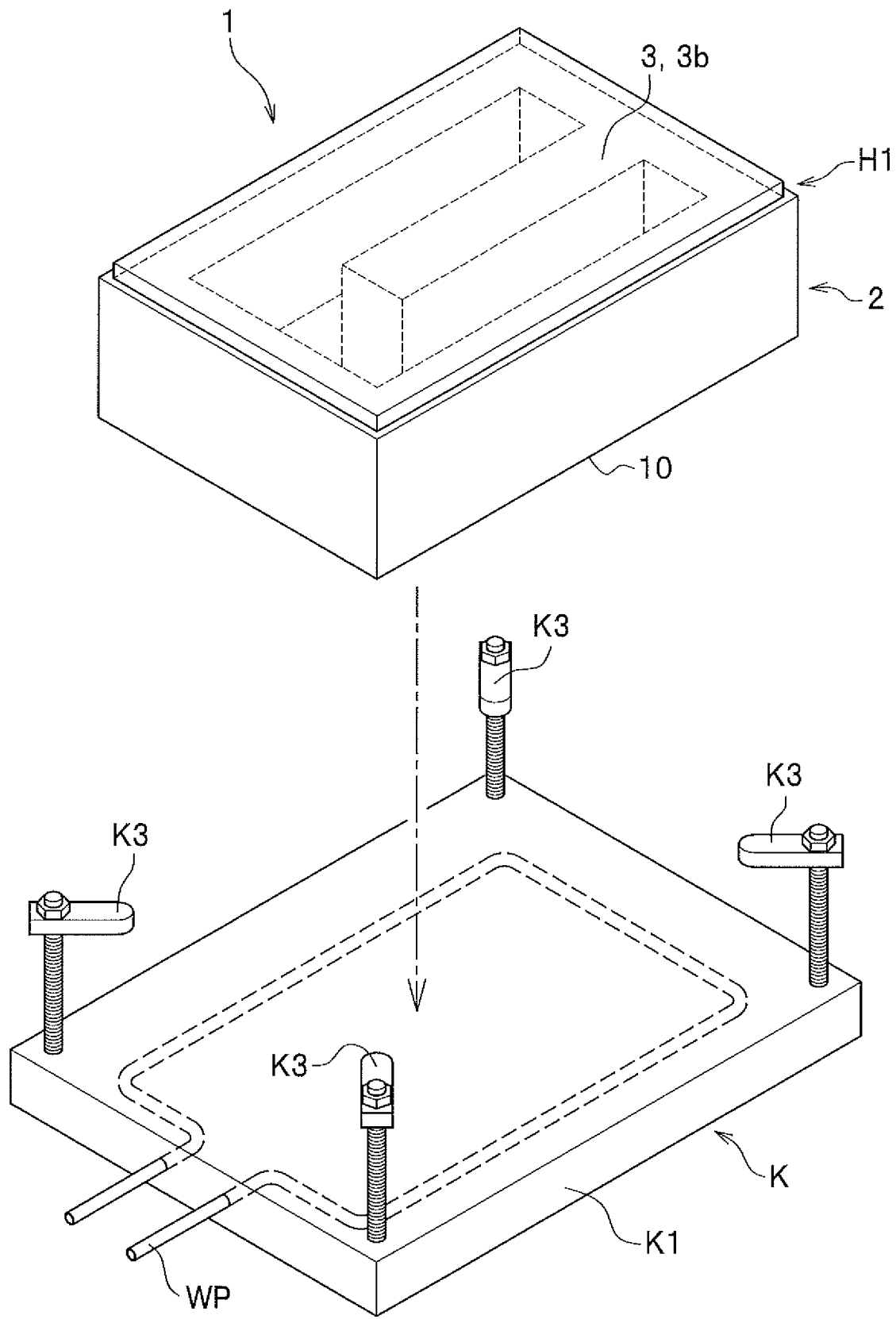
FIG. 13 is a perspective view showing a second modified example of the method for manufacturing the liquid-cooling jacket according to the first embodiment.

Next, a second modified example of the method for manufacturing the liquid-cooling jacket according to the first embodiment will be described. As shown in FIG. 13, this modified example differs from the first embodiment on the point that the provisional joining process and the primary joining process are performed with the use of a cooling plate in this modified example.

As shown in FIG. 13, in the modified example, when the fixing process mentioned in the above is performed, the jacket body 2 and the sealing body 3 are fixed to a table K. The table K is composed of a base plate K1 having a rectangular parallelepiped shape, clamps K3 provided at four corners of the base plate K1, and a cooling pipe WP provided inside the base plate K1. The table K holds the jacket body 2 so as not to be moved and is a member to function as "a cooling plate" of the present invention.

The cooling pipe WP is a tubular member embedded inside the base plate K1. A cooling medium for cooling the base plate K1 flows in the cooling pipe WP. A position of the cooling pipe WP to be disposed, that is, a shape of the cooling path along which the cooling medium flows is not limited in particular. In this modified example, it is a plane shape along the moving locus of the rotary tool F1 in the first overlapped part joining process. Namely, the cooling pipe WP is disposed so that the cooling pipe WP and the first overlapped part H1 nearly overlap with each other in a plan view.

In the provisional joining process and the primary joining process of the modified example, after the jacket body 2 and the sealing body 3 are fixed to the table K, friction stir welding is performed while letting the cooling medium flow in the cooling pipe WP. Thereby, since frictional heat at the time of performing friction stirring can be reduced, the deformation of the liquid-cooling jacket 1 due to thermal contraction can be reduced. Furthermore, in the modified example, since the cooling path and the first overlapped part H1 (the moving locus of the rotary tool F1) overlap with each other in a plan view, a portion where frictional heat is generated can be cooled intensively. Thereby, cooling efficiency can be improved. Still further, since the cooling medium is let to flow in the disposed cooling pipe WP, management of the cooling medium is easy. Furthermore, since the table K (cooling plate) and the jacket body 2 come into contact with each other face to face, cooling efficiency can be improved.

Note that, the cooling pipe WP may be provided at a position corresponding to the second overlapped part H2. Furthermore, friction stir welding may be performed while letting the cooling medium flow also in the inside of the jacket body 2 together with the state where the jacket body 2 and the sealing body 3 are cooled with the use of the table K (cooling plate). In this way, frictional heat can be reduced, so that the deformation of the liquid-cooling jacket 1 due to thermal contraction can be reduced. Still further, in a case where friction stir welding is performed while letting the cooling medium flow only in the inside of the jacket body 2, the liquid-cooling jacket can be cooled with the use of the jacket body 2 itself without any cooling plate or the like.

Second Embodiment

Figure 14:
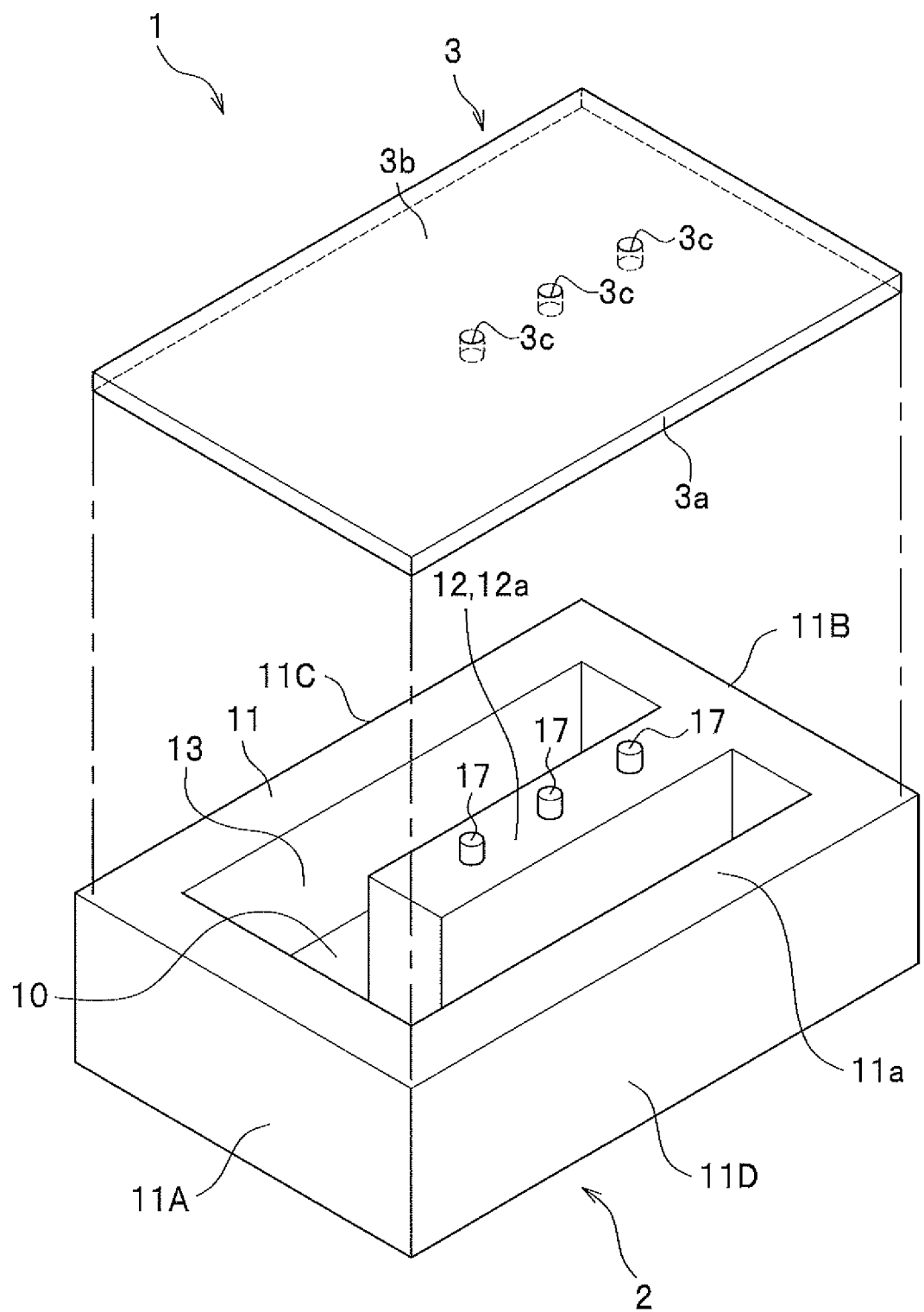
FIG. 14 is an exploded perspective view showing a liquid-cooling jacket according to a second embodiment of the present invention.

Next, a method for manufacturing a liquid-cooling jacket according to a second embodiment of the present invention will be described. As shown in FIG. 14, the first one of differences between the second embodiment and the first embodiment is that three projection parts 17 are formed apart from each other on the end surface 12a of the support part 12. The shape of each projection part 17 is not limited in particular, and in this embodiment, each has a cylindrical shape. Furthermore, the number of the projection parts 17 is not limited in particular, and in this embodiment, the three are arranged in the longitudinal direction of the support part 12. Still further, three hole parts 3c, each of which has a circular shape in a plan view and passes through the sealing body 3 in the thickness direction thereof, are formed in the sealing body 3. Each hole part 3c is a hole part in which one projection part 17 is inserted and is formed at a position corresponding to the one projection part 17. Each hole part 3c has such a size that the one projection part 17 is inserted in almost without a gap.

In the second embodiment, in an overlapping process, each projection part 17 is inserted in the corresponding hole part 3c of the sealing body 3, so that a butting part U, which is formed by the hole wall surface of a hole part 3c and the side surface of the projection part 17, is formed.

Figure 15:
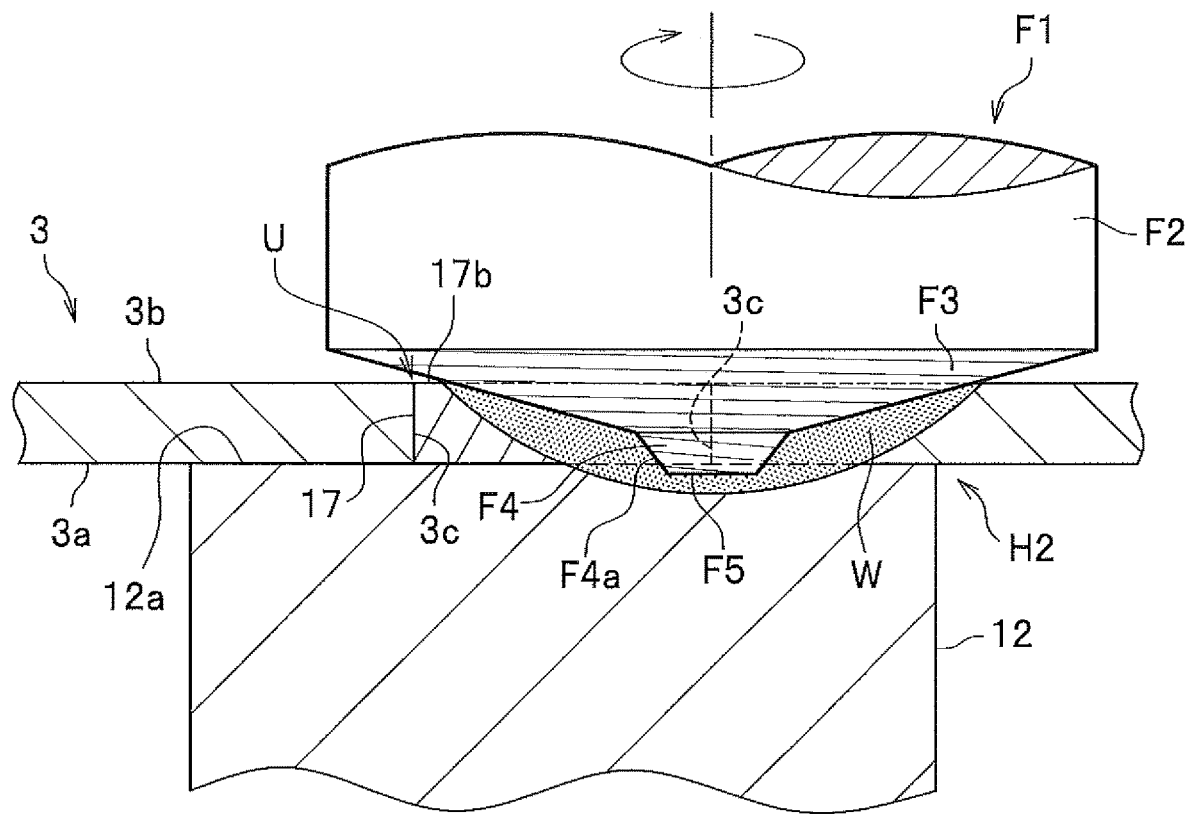
FIG. 15 is a longitudinal cross sectional view showing a primary joining process of a method for manufacturing the liquid-cooling jacket according to the second embodiment of the present invention.

And then, as shown in FIG. 15, in a primary joining process, three butting parts U are each joined by friction stirring as a second overlapped part joining process. Since each butting part U has a circular shape in a plan view, the rotary tool F1 is moved along each butting part U so as to draw a circle in a plan view. As to friction stir welding to each butting part U, the insertion depth of the rotary tool F1 is set so that at least a portion of the base side pin F3 comes into contact with the front surface 3b of the sealing body 3 and a front surface 17b of a projection part 17. That is, friction stir welding is performed while the front surface 3b of the sealing body 3 and the front surface 17b of a projection part 17 are being held by the outer peripheral surface of the base side pin F3 of the rotary tool F1. Furthermore, friction stir welding is performed while the tip side pin F4 is in contact with the jacket body 2 and the sealing body 3. In this embodiment, friction stir welding is performed in a state where the tip side pin F4 is in contact with the sealing body 3, a projection part 17 and the support part 12 of the jacket body 2. That is, the insertion depth of the rotary tool F1 is set so that the flat surface F5 of the tip side pin F4 is located at a position lower than the second overlapped part H2 (end surface 12a of the support part 12). In other words, the insertion depth of the rotary tool F1 is set so that the second overlapped part H2 is located at the side surface of the tip side pin F4. As apparent from the above description, the first overlapped part joining process and the second overlapped part joining process are not continuously performed.

Note that, in the second overlapped part joining process, friction stir welding may be performed in a state where at least a part of the base side pin F3 is in contact with the front surface 3b of the sealing body 3 and the tip side pin F4 is in contact with the sealing body 3 and a projection part 17 of the jacket body 2. Namely, similarly to the first modified example of the first embodiment, the insertion depth of the rotary tool F1 may be set so that the flat surface F5 of the tip side pin F4 is located at a position upper than the second overlapped part H2 (end surface 12a of the support part 12).

Figure 16:
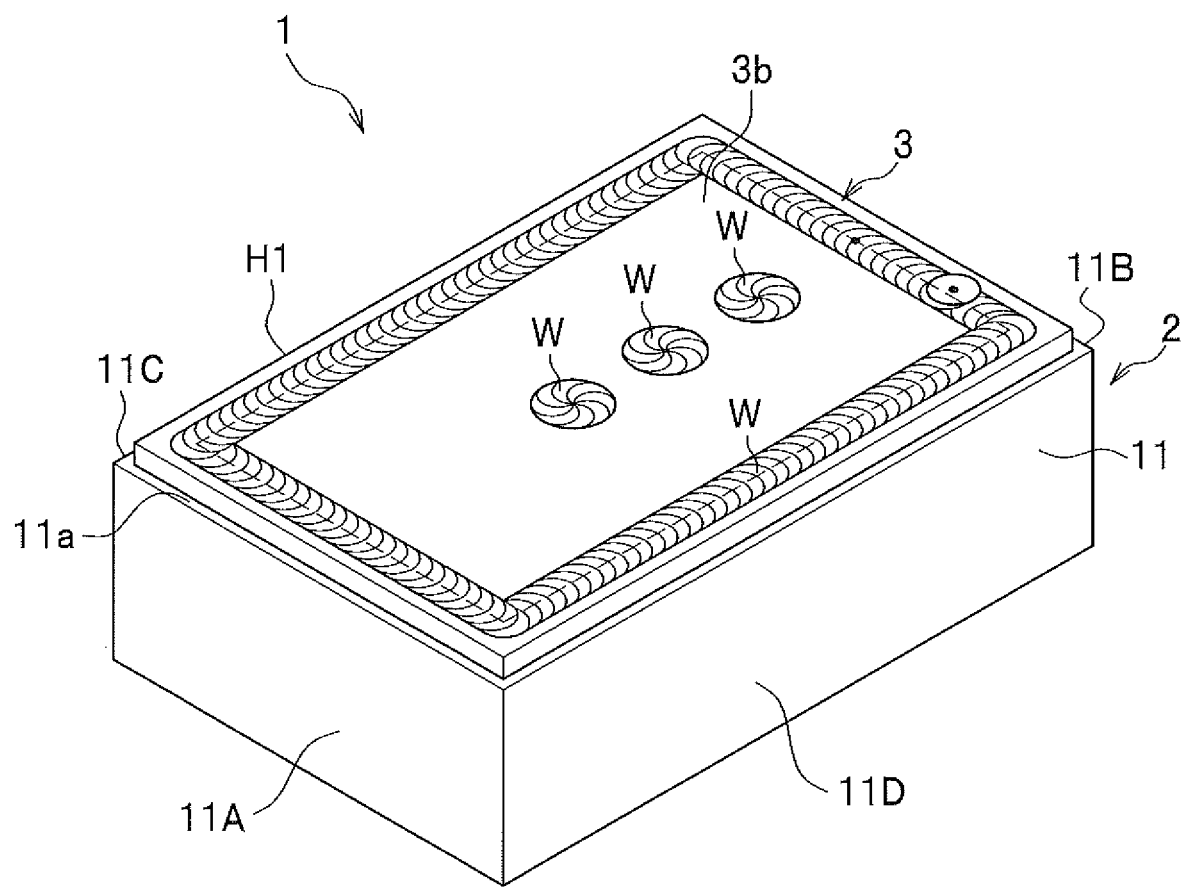
FIG. 16 is a perspective view showing the liquid-cooling jacket according to the second embodiment of the present invention.

FIG. 16 is a perspective view of the liquid-cooling jacket 1 finished via all processes in the second embodiment. The plasticized region W is generated by performing the first overlapped part joining process along the outer periphery of the sealing body 3 by one round in a plan view. Furthermore, the three circular plasticized regions W arranged on the support part 12 in the longitudinal direction thereof in a plan view are also generated by performing the second overlapped part joining process.

Advantageous effects roughly equivalent to the first embodiment can work also by the method for manufacturing a liquid-cooling jacket according to the second embodiment described in the above.

Still further, according to this embodiment, in the primary joining process, friction stir welding can be performed also to the butting part U where the hole wall of a hole part 3c and the side surface of the projection part 17 are butted each other. Therefore, the joining strength between the jacket body 2 and the sealing body 3 can be enhanced.

Third Embodiment

Figure 17:
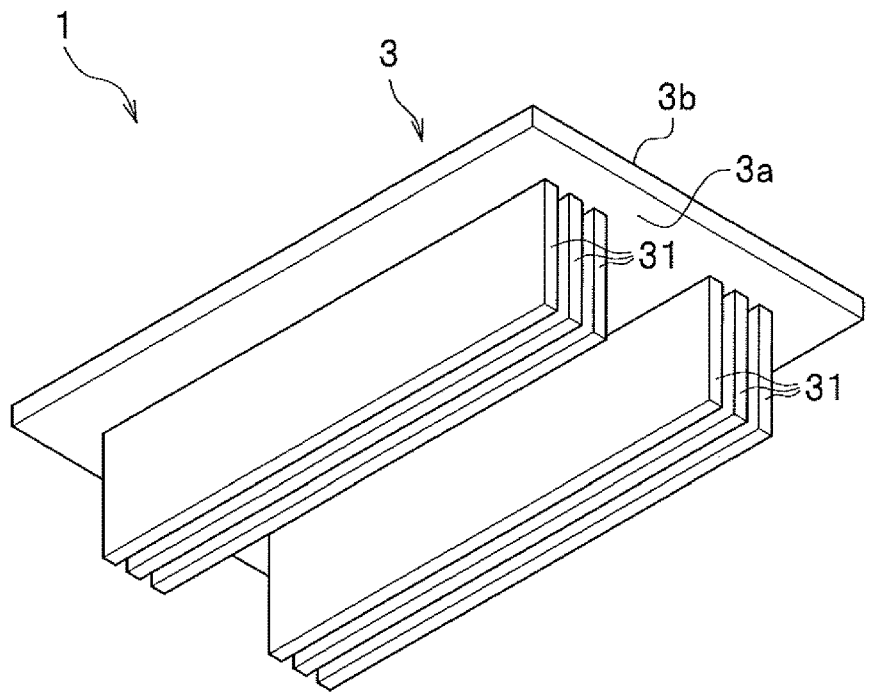
FIG. 17 is an exploded perspective view showing a liquid-cooling jacket according to a third embodiment of the present invention.
Figure 17:
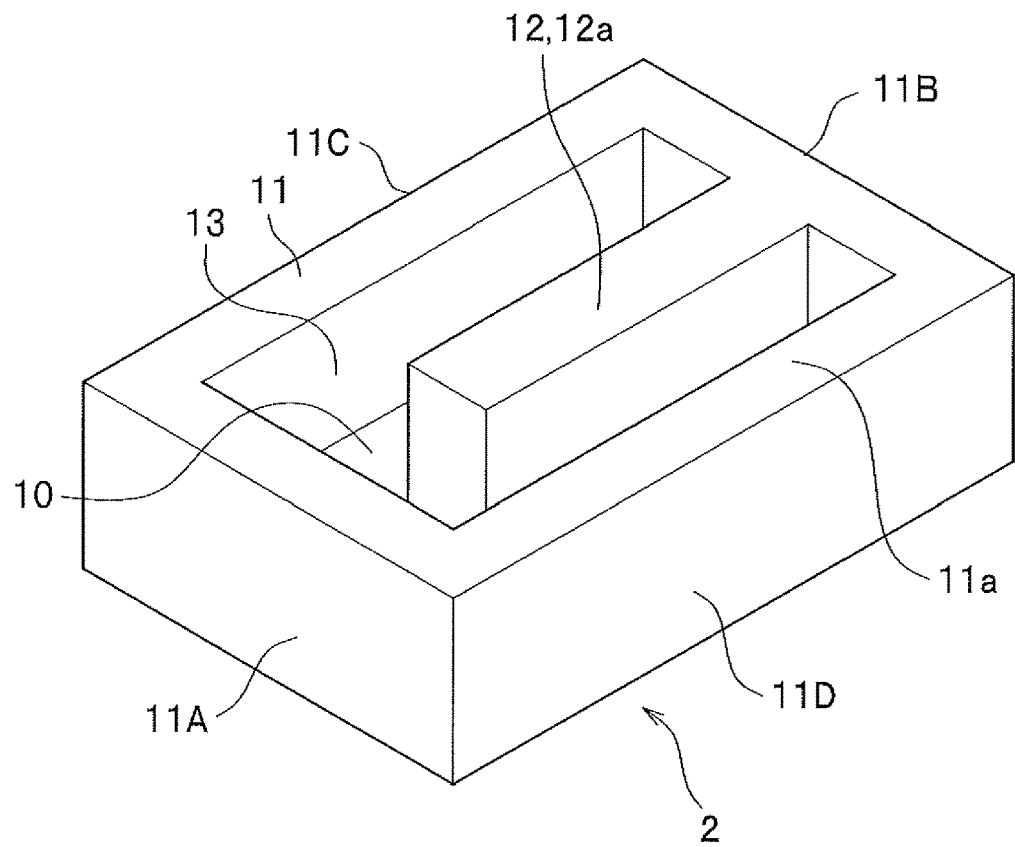

Next, a method for manufacturing a liquid-cooling jacket according to a third embodiment of the present invention will be described. The third embodiment differs from the first embodiment on the point that fins 31 are provided on the sealing body 3 as shown in FIG. 17. That is, a plurality of fins 31 are provided on the back surface 3a of the sealing body 3. The jacket body 2 has the same structure as that of the first embodiment.

The plurality of fins 31 are hung vertically from the back surface 3a of the sealing body 3 with a prescribed distance between adjacent two among them. Each fin 31 is provided on the back surface 3a of the sealing body 3 so that the fin 31 is housed in the recessed part 13 of the jacket body 2 without interfering with the support part 12 when an overlapping process is performed. Except using the sealing body 3 provided with the fins 31, each process of the first embodiment is similar to that of the third embodiment.

According to the method for manufacturing a liquid-cooling jacket according to the third embodiment, the liquid-cooling jacket 1 provided with the plurality of fins 31 can be manufactured. Since the liquid-cooling jacket 1 is provided with the fins 31, cooling efficiency can be improved. Note that, the fins 31 may be provided on the bottom part 10 side of the jacket body 2.

Explanations are done on the embodiments of the present invention in the above. Design changes can be appropriately done within the range of the purpose of the present invention.

DESCRIPTION OF THE SYMBOLS

1 Liquid-cooling jacket
2 Jacket body
3 Sealing body
3a Back surface
10 Bottom part
11 Peripheral wall part
11a End surface
11A Another wall part
11B One wall part
12 Support part
13 Recessed part
14 Hollow part
31 Fin
e1 End point (Outside)
F1 Rotary tool
F2 Base shaft
F3 Base side pin
F4 Tip side pin
F5 Flat surface
110 Step part
110a Step bottom surface
110b Step side surface
111 Spiral groove
A Tapered angle (of the base side pin)
B Tapered angle
C Step angle
D Spiral angle
X1 Distance (in the base side pin)
X2 Distance
Y1 Height (of the step side surface)
Y2 Height
H1 First overlapped part
H2 Second overlapped part
U Butting part
W Plasticized region
K Table (Cooling plate)
WP Cooling path, Cooling pipe

The invention claimed is:

1. A method for manufacturing a liquid-cooling jacket, the liquid-cooling jacket including: a jacket body having a bottom part and a peripheral wall part standing on a periphery of the bottom part; and a sealing body to seal a recessed part of the jacket body, the jacket body and the sealing body together defining a hollow part in which heat transport fluid flows, the method comprising:
- an overlapping process in which the sealing body is placed on an end surface of the peripheral wall part in such a way that the end surface and a back surface of the sealing body are overlapped with each other to form a first overlapped part; and
- a primary joining process in which primary joining is performed by friction stirring, the primary joining process including inserting a rotary tool provided with a base side pin and a tip side pin in the first overlapped part from a front surface of the sealing body and moving the rotary tool once around the recessed part along the first overlapped part in a state where the base side pin and the tip side pin are in contact with the sealing body,
- wherein a tapered angle of the base side pin is 135 to 160 degrees and larger than another tapered angle of the tip side pin,
- wherein a step part is formed on an outer peripheral surface of the base side pin,
- wherein a spiral groove is formed on an outer peripheral surface of the tip side pin, the spiral groove including a spiral bottom surface and a spiral side surface adjacent to the spiral bottom surface, the spiral bottom surface and spiral side surface forming a spiral angle, the spiral angle being an interior angle with respect to the outer peripheral surface of tip side pin and being set to 45 to 90 degrees,
- wherein the spiral bottom surface is further adjacent to a second part of the spiral side surface at the outer peripheral surface of the tip side, the second part of the spiral side surface being located after a single revolution of the spiral side surface about the tip side pin, the second part of the spiral side surface and the spiral bottom surface forming an apex, and
- wherein in the primary joining process, the first overlapped part is joined in a state where the tip side pin is in contact with only the sealing body or with both the jacket body and the sealing body while the base side pin is in contact with the sealing body.

2. The method for manufacturing a liquid-cooling jacket according to claim 1, wherein a support part is provided on either the bottom part of the jacket body or the back surface of the sealing body and comes into contact with the other.

3. The method for manufacturing a liquid-cooling jacket according to claim 1, wherein the jacket body is provided with a support part standing on the bottom part and to come into contact with the back surface of the sealing body, and
- wherein in the primary joining process, in addition to friction stir welding to the first overlapped part, friction stir welding is performed also to a second overlapped part where the back surface of the sealing body and an end surface of the support part are overlapped each other.

4. The method for manufacturing a liquid-cooling jacket according to claim 3, wherein in the primary joining process, the second overlapped part is joined in a state where the tip side pin is in contact with only the sealing body or with both the jacket body and the sealing body while the base side pin is in contact with the sealing body.

5. The method for manufacturing a liquid-cooling jacket according to claim 3, wherein the support part is formed continuously with the peripheral wall part, and
- wherein in the primary joining process, friction stir welding is performed to the first overlapped part and to the second overlapped part continuously.

6. The method for manufacturing a liquid-cooling jacket according to claim 5, wherein the support part is formed continuously with one wall part of the peripheral wall part and apart from another wall part facing the one wall part, and
- wherein in the primary joining process, the rotary tool is inserted in the front surface of the sealing body at a position corresponding to the support part, friction stir welding is performed to the first overlapped part and to the second overlapped part continuously, and then the rotary tool is pulled up from the sealing body at an outer position than a plasticized region generated in the first overlapped part.

7. The method for manufacturing a liquid-cooling jacket according to claim 1, wherein the jacket body is provided with a support part standing on the bottom part and to come into contact with the back surface of the sealing body, the support part having a projection part on an end surface of the support part,
- wherein the sealing body is provided with a hole part in which the projection part is inserted,
- wherein in the overlapping process, the projection part is inserted in the hole part in such a way that a hole wall of the hole part and a side surface of the projection part are butted each other to form a butting part and a second overlapped part where the back surface of the sealing body and the end surface of the support part are overlapped each other, and
- wherein in the primary joining process, in addition to friction stir welding to the first overlapped part, friction stir welding is performed also to the second overlapped part where the back surface of the sealing body and the end surface of the support part are overlapped each other and to the butting part where the hole wall of the hole part of the sealing body and the side surface of the projection part of the support part are butted each other.

8. The method for manufacturing a liquid-cooling jacket according to claim 7, wherein in the primary joining process, as to friction stir welding to the butting part, the second overlapped part and the butting part are each joined in a state where the base side pin is in contact with both the jacket body and the sealing body, and a tip of the tip side pin is inserted more deeply than the second overlapped part.

9. The method for manufacturing a liquid-cooling jacket according to claim 1, further comprising a repairing process in which a pull-up trace of the rotary tool is repaired by filling the pull-up trace with weld metal, the pull-up trace remaining on the front surface of the sealing body.

10. The method for manufacturing a liquid-cooling jacket according to claim 1, wherein in the primary joining process, a cooling plate is provided on the bottom part of the jacket body, and friction stir welding is performed while cooling the jacket body and the sealing body.

11. The method for manufacturing a liquid-cooling jacket according to claim 10, wherein a cooling path of the cooling plate, along which a cooling medium flows, has a plane shape at least along a moving locus of the rotary tool.

12. The method for manufacturing a liquid-cooling jacket according to claim 10, wherein a cooling path of the cooling plate, along which a cooling medium flows, is composed of a cooling pipe embedded in the cooling plate.

13. The method for manufacturing a liquid-cooling jacket according to claim 1, wherein in the primary joining process, friction stir welding is performed while letting a cooling medium flow in an inside of the jacket body to cool the jacket body and the sealing body.

14. The method for manufacturing a liquid-cooling jacket according to claim 1, wherein a plurality of fins are provided on at least either the bottom part of the jacket body or the back surface of the sealing body.

15. The method for manufacturing a liquid-cooling jacket according to claim 1, wherein
- a step part is formed on the outer peripheral surface of the base side pin, which has a spiral shape in a plan view and has a stepped shape in a side view; and
- the step part includes a step bottom surface and a step side surface, the step bottom surface is formed from a rotational axis of the rotary tool toward an outer periphery, a step angle defined by the step bottom surface and the step side surface is set to 85 to 120 degrees, the step bottom surface of the step part is adjacent to a step side surface of a step part formed at an outer side in the base side pin, and the step side surface of the step part is adjacent to a step bottom surface of a step part formed at an inner side in the base side pin.

\* \* \* \* \*